US012603659B2

(12) United States Patent
Lee et al.

(10) Patent No.: US 12,603,659 B2
(45) Date of Patent: Apr. 14, 2026

(54) DEVICE AND METHODS FOR RECONFIGURABLE ANALOG INPUT MONITORING

(71) Applicant: Microchip Technology Incorporated, Chandler, AZ (US)

(72) Inventors: Thomas Youbok Lee, Chandler, AZ (US); Ibiyemi Omole, Gilbert, AZ (US); Jimmy Yu, Chandler, AZ (US); Santosh Patel, Bengaluru (IN); Daniel Meacham, Del Mar, CA (US); Hadj Attlassy, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 148 days.

(21) Appl. No.: 18/440,552

(22) Filed: Feb. 13, 2024

(65) Prior Publication Data

US 2025/0158629 A1 May 15, 2025

(30) Foreign Application Priority Data

Nov. 14, 2023 (IN) .............................. 202311077542

(51) Int. Cl.
*H03M 1/12* (2006.01)

(52) U.S. Cl.
CPC ................................... *H03M 1/129* (2013.01)

(58) Field of Classification Search
None
See application file for complete search history.

(56) References Cited

U.S. PATENT DOCUMENTS

| | | | | |
|---|---|---|---|---|
| 6,147,486 A * | 11/2000 | Koss | ................... | F02D 41/0097 |
| | | | | 324/173 |
| 6,762,707 B2 * | 7/2004 | Wolf | ..................... | H03M 1/005 |
| | | | | 341/155 |
| 11,933,823 B1 * | 3/2024 | Raju | .................. | G01R 19/2506 |
| 2010/0289681 A1 * | 11/2010 | Kamikisaki | ......... | H03M 1/1295 |
| | | | | 341/122 |
| 2019/0377405 A1 * | 12/2019 | Uan-Zo-Ii | ............. | G06F 1/3296 |
| 2021/0234548 A1 * | 7/2021 | Tangirala | .............. | H03M 1/468 |
| 2025/0202360 A1 * | 6/2025 | Kaligonahalli Thippeswamy | ...... | |
| | | | | H03K 5/04 |

OTHER PUBLICATIONS

Cypress Semiconductor Corporation, "Programmable Threshold Comparator Datasheet, CMPPRG V 3.3," URL: https://www.infineon.com/dgdl/Infineon-CMPPRG_001-13262-Software%20Module%20Datasheets-v03_03-EN.pdf?fileId=8ac78c8c7d0d8da4017d0f982030071b, 11 pages, Mar. 12, 2015.
International Search Report and Written Opinion, Application No. PCT/US2024/029206, 11 pages, Sep. 20, 2024.

* cited by examiner

*Primary Examiner* — Lam T Mai
(74) *Attorney, Agent, or Firm* — SLAYDEN GRUBERT BEARD PLLC

(57) ABSTRACT

An ADC system may include an ADC, a comparator, a voltage source, a comparator output polarity control circuit and a comparator output counter. An analog input signal may be input to a first input of the comparator, and an output of the voltage source may be input to a second input of the comparator. The comparator may generate an output to the comparator output polarity control circuit, and the comparator output counter may count clock cycles while the comparator output is asserted and may assert a monitor output based on the comparator output counter value. The monitor output may be an interrupt, an alarm or other system alerts and may control system operation.

19 Claims, 3 Drawing Sheets

DEVICE AND METHODS FOR RECONFIGURABLE ANALOG INPUT MONITORING

PRIORITY

This application claims priority to commonly owned Indian Provisional Patent Application No. 202311077542 filed Nov. 14, 2023, the entire contents of which are hereby incorporated by reference for all purposes.

FIELD OF THE INVENTION

The present disclosure relates to devices and methods for reconfigurable analog input monitoring.

BACKGROUND

Analog-to-digital converters (ADCs) may be used to convert analog input signals to digital codes for processing and monitoring by a microcontroller or other processor. A microcontroller may be a system on a chip that generally comprises a processor, a memory, a plurality of input/output ports, and a variety of peripheral devices. In particular, a variety of peripheral devices may be provided such as configurable logic cells, complementary waveform/output generators, dedicated arithmetic units, numerical controlled oscillators and programmable switch mode controllers. Microcontrollers may include host controllers to communicate with peripheral devices over a communication protocol. The microcontroller may include a digital processor with memory and a plurality of programmable input and output ports. The microcontroller may be a host device capable to communicate with one or more secondary devices.

In one of various examples, an analog input signal may be monitored to ensure the analog input signal remains within predetermined limits. In one of various examples, a threshold level may be set and the analog input signal may be monitored to determine if the analog input signal is above or below the threshold level. Time-consuming and power-intensive processing may be required to determine if the associated analog input signal remains within those predetermined limits or is above or below the threshold level.

Additionally, in examples where an analog signal is continuously monitored, such as for temperature signals when identifying thermal overload conditions, significant power is consumed to continually convert the analog signal. The microcontroller or processor may continually interrupt its processing to deal with the data from the converter, even when the data from the converter is far from any threshold level. As one of various examples, an ADC may be monitoring a temperature signal and may be continually converting the temperature signal when the associated temperature value is well below a thermal overload condition. This wastes power and increases the processing load on the microcontroller or processor.

There is a need for an ADC system which may monitor input signals and may only perform conversions when the analog signal meets a predetermined condition.

SUMMARY

The examples herein enable a device and methods for monitoring input signals in an ADC system.

According to one aspect, a device includes an analog-to-digital converter (ADC) to receive at least one analog input signal. The device includes a voltage source to generate a threshold voltage, the threshold voltage based on a predetermined condition. The device includes a comparator to receive the threshold voltage, and the comparator generates a comparator output based on a comparison of the at least one analog input signal and the threshold voltage. The device includes a comparator output polarity control circuit to generate and based on the output of the comparator and based on a polarity configuration setting. The device includes a comparator output counter to count edges of a clock signal based on the output of the comparator output polarity control circuit, the count comprising a comparator output counter value. The comparator output counter generates one or more monitor outputs based on the comparator output counter value.

According to one aspect, a system includes an analog-to-digital converter (ADC) to receive at least one analog input signal. The system includes a voltage source to generate a threshold voltage, the threshold voltage based on a predetermined condition. The system includes a switch to selectively couple the at least one analog input signal to a comparator, the comparator to receive the threshold voltage. The comparator generates a comparator output based on a comparison of the at least one analog input signal and the threshold voltage. The system includes a comparator output polarity control circuit to generate an output based on the output of the comparator and based on a polarity configuration setting. The system includes a comparator output counter to count edges of a clock signal based on the output of the comparator output polarity control circuit, the count comprising a comparator output counter value. The comparator output counter generates one or more monitor outputs based on the comparator output counter value. The system includes a microcontroller to receive the one or more monitor outputs.

According to one aspect, a method includes steps of: configuring a voltage source to output a threshold voltage, comparing an analog input signal to the threshold voltage, obtaining a comparison result, and modifying system operation based on the comparison result.

DETAILED DESCRIPTION

Figure 1:
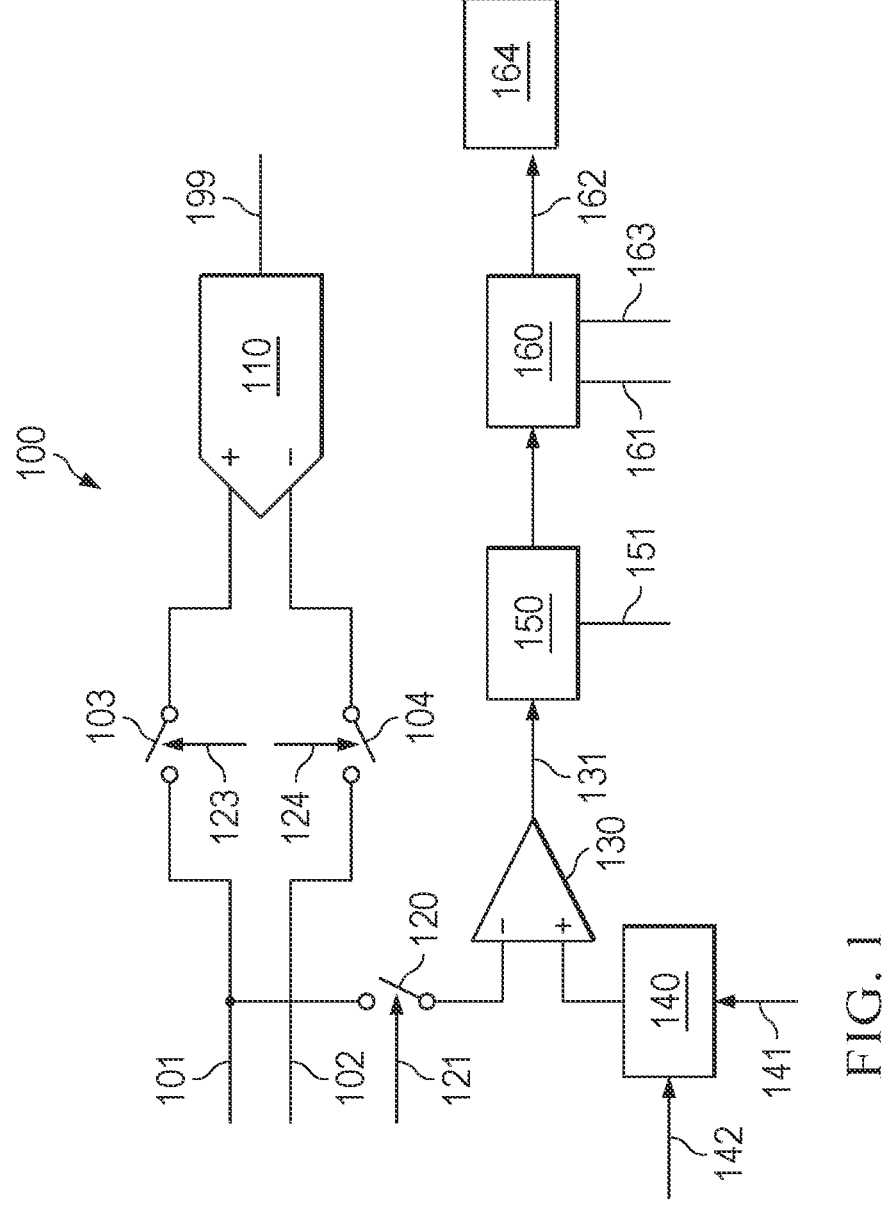
FIG. 1 illustrates one of various examples of a device for monitoring analog input signals.

FIG. 1 illustrates one of various examples of a device 100 for monitoring analog input signals. Device 100 includes a positive polarity analog input signal 101 and a negative polarity analog input signal 102. Positive polarity analog input signal 101 may be coupled to a positive input of ADC 110 through switch 103. Negative polarity analog input signal 102 may be coupled to a negative input of ADC 110 through switch 104.

ADC 110 may be a successive approximation register (SAR) converter, or may be another type of converter, including but not limited to a flash ADC, a sigma-delta ADC, a dual-slope ADC, a pipelined ADC, or another type of ADC not specifically mentioned. ADC 110 may generate output 199.

Switch 120 may selectively couple positive polarity analog input signal 101 to an inverting input of comparator 130. In operation, control signal 121 may control the state of switch 120 and may selectively couple positive polarity analog input signal 101 to comparator 130.

Switch 103 may be coupled between positive polarity analog input signal 101 and the positive input of ADC 110. Control signal 123 may control the state of switch 103. Switch 104 may be coupled between negative polarity analog input signal 102 and the negative input of ADC 110. Control signal 124 may control the state of switch 104.

The non-inverting input of comparator 130 may be coupled to an output of a controllable voltage source 140. In operation, threshold select setting 141 may be a predetermined condition and may set an output voltage of controllable voltage source 140. Controllable voltage source 140 may output a voltage representing the voltage set by threshold select setting 141. In one of various examples, controllable voltage source 140 may comprise a digital-to-analog converter (DAC), and threshold select setting 141 may comprise a register setting. Voltage reference 142 may be input to controllable voltage source 140. Threshold select setting 141 may specify a percentage or ratio of voltage reference 142 to be the output of controllable voltage source 140.

In operation, comparator 130 may output a logic low level at comparator output 131 when the voltage on positive polarity analog input signal 101 exceeds the output voltage of controllable voltage source 140. Comparator output polarity control circuit 150 may monitor comparator output 131 and may output a voltage based on comparator output 131 and a polarity configuration setting 151.

In one of various examples, positive polarity analog input signal 101 may represent an output of a temperature sensor, wherein a higher voltage on positive polarity analog input signal 101 may represent a higher temperature. Device 100 may detect an over-temperature condition. In operation, switch 120 may be closed in a comparator-only mode and comparator 130 may monitor the voltage on positive polarity analog input signal 101 and may output a logic low signal when the voltage on positive polarity analog input signal 101 exceeds the voltage output of controllable voltage source 140. Switch 103 and switch 104 may be in an open position, and ADC 110 may be in a reset or low-power state. The logic low signal at comparator output 131 may represent an over-temperature condition, and polarity configuration setting 151 may configure comparator output polarity control circuit 150 to output a positive voltage when a logic low signal is output from comparator 130. In other examples, device 100 may be configured to detect an under-temperature condition. Comparator 130 may monitor the voltage on positive polarity analog input signal 101 and may output a logic high signal when the voltage on positive polarity analog input signal 101 is below the voltage output of controllable voltage source 140. The logic high signal at comparator output 131 may represent an under-temperature condition, and polarity configuration setting 151 may configure comparator output polarity control circuit 150 to output a positive voltage when a logic high signal is output from comparator 130.

In one of various examples, positive polarity analog input signal 101 may represent a battery voltage. In operation, comparator 130 may monitor the voltage on positive polarity analog input signal 101 and may output a logic high signal when the voltage on positive polarity analog input signal 101 drops below the voltage output of controllable voltage source 140. The logic high signal at comparator output 131 may represent an undervoltage condition of the battery voltage, and polarity configuration setting 151 may configure comparator output polarity control circuit 150 to output a positive voltage when a logic high signal is output from comparator 130.

Comparator output counter circuit 160 may count cycles of clock input 161 while the output of comparator output polarity control circuit 150 may be logic high and may generate a comparator output counter value. After a predetermined number of clock cycles, programmed by counter configuration setting 163, comparator output counter circuit 160 may output a logic high signal at monitor output 162 based on the comparator output counter value. In one of various examples, if the output of comparator output polarity control circuit 150 transitions to logic low before the predetermined number of clock cycles are counted by comparator output counter circuit 160, monitor output 162 may stay at a logic low level. Once the output of comparator output polarity control circuit 150 is detected as logic low for a predetermined number of clock cycles, monitor output 162 may then transition to a logic low level. Comparator output counter circuit 160 may count a predetermined number of clock cycles to transition monitor output 162 to a logic low level, programmed by counter configuration setting 163. In one of various examples, the minimum time period may be between 62 usec and 531 usec.

Monitor output 162 may be input to a microcontroller 164, processor or other control circuit to control operation of a larger system. In one of various examples, monitor output 162 may enable ADC 110 to initiate an analog-to-digital conversion of positive polarity analog input signal 101 and negative polarity analog input signal 102, responsive to a logic high signal on monitor output 162. Switch 103 and switch 104 may be in a closed position during analog-to-digital conversion. Monitor output 162 may comprise a trigger signal. Monitor output 162 may comprise multiple monitor output signals, including but not limited to an ADC enable signal and an ADC clock signal. Monitor output 162 may be coupled to ADC 110 and may initiate a data conversion in ADC 110.

In this manner, device 100 may enable a low-power analog input monitoring and conversion path through switch 120, comparator 130, controllable voltage source 140, comparator output polarity control circuit 150, comparator output counter circuit 160, and ADC 110. Once the low-power analog input monitor path triggers monitor output 162, ADC 110 may be enabled to more precisely monitor positive polarity analog input signal 101 and negative polarity analog input signal 102 through switches 103 and 104, respectively. Monitor output 162 may similarly trigger other system operations, including but not limited to an interrupt service routine. Monitor output 162 may be an alarm signal. Monitor output 162 may be output to an external pin.

The example of FIG. 1 is illustrated as a differential input, with positive polarity analog input signal 101 and negative polarity analog input signal 102. In other examples, a single-ended input may be monitored and negative polarity analog input signal 102 may be coupled to a ground node. In other examples, a pseudo-differential input may be monitored and negative polarity analog input signal 102 may be coupled to a common mode voltage. The example of FIG. 1 is illustrated with positive polarity analog input signal 102 coupled to comparator 130 through switch 120, but this is not intended to be limiting. In other examples, negative polarity analog input signal 102 may be coupled to comparator 130 through switch 120.

FIG. 1 illustrates an example where a logic high signal on monitor output signal 162 is considered an asserted signal, it being understood that in other example a logic low signal on monitor output signal 162 may be considered an asserted signal. FIG. 1 illustrates an example where a logic high signal on comparator output polarity control circuit 150 is considered an asserted signal, it being understood that in other example a logic low signal on comparator output polarity control circuit 150 may be considered an asserted signal. Similarly the polarity of the inputs of comparator 130 may set in accordance with particular needs without exceeding the scope.

Figure 2:
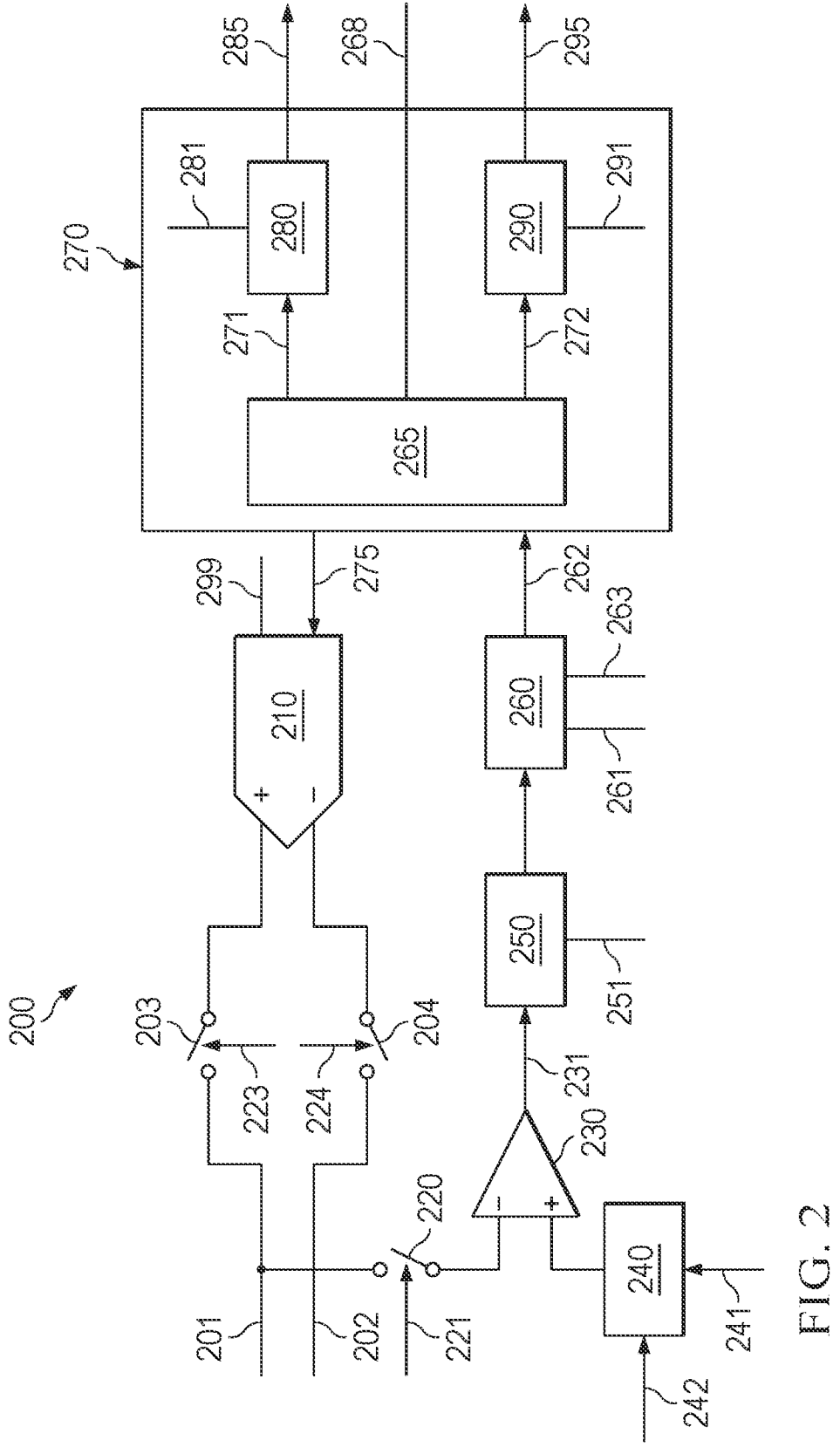
FIG. 2 illustrates one of various examples of a system for monitoring analog input signals.

FIG. 2 illustrates another example of a device 200 for monitoring analog input signals. Device 200 includes a positive polarity analog input signal 201 and a negative polarity analog input signal 202. Positive polarity analog input signal 201 may be coupled to a positive input of ADC 210 through switch 203. Negative polarity analog input signal 202 may be coupled to a negative input of ADC 210 through switch 204.

ADC 210 may be a successive approximation register (SAR) converter, or may be another type of converter, including but not limited to a flash ADC, a sigma-delta ADC, a dual-slope ADC, a pipelined ADC, or another type of ADC not specifically mentioned. ADC 210 may generate output 299.

Switch 220 may selectively couple positive polarity analog input signal 201 to an inverting input of comparator 230. In operation, control signal 221 may control the state of switch 220 and may selectively couple positive polarity analog input signal 201 to comparator 230.

Switch 203 may be coupled between positive polarity analog input signal 201 and the positive input of ADC 210. Control signal 223 may control the state of switch 203. Switch 204 may be coupled between negative polarity analog input signal 202 and the negative input of ADC 210. Control signal 224 may control the state of switch 204.

The non-inverting input of comparator 230 may be coupled to an output of controllable voltage source 240. Voltage reference 242 may be input to controllable voltage source 240. In operation, threshold select setting 241 may set an output voltage of controllable voltage source 240. Controllable voltage source 240 may output a voltage representing the voltage set by threshold select setting 241. In one of various examples, controllable voltage source 240 may comprise a digital-to-analog converter (DAC), and threshold select setting 241 may comprise a register setting. Controllable voltage source 240 may output a voltage based on a percentage of voltage reference 242.

In operation, comparator 230 may output a logic low level at comparator output 231 when the voltage on positive polarity analog input signal 201 exceeds the output voltage of controllable voltage source 240. Comparator output polarity control circuit 250 may monitor comparator output 231 and may output a voltage based on comparator output 231 and a polarity configuration setting 251.

In one of various examples, positive polarity analog input signal 201 may represent an output of a temperature sensor, wherein a higher voltage on positive polarity analog input signal 201 may represent a higher temperature. Device 200 may be configured to detect an over-temperature condition. In operation, switch 220 may be closed and comparator 230 may monitor the voltage on positive polarity analog input signal 201 and may output a logic low signal when the voltage on positive polarity analog input signal 201 exceeds the voltage output of controllable voltage source 240. The logic low signal at comparator output 231 may represent an over-temperature condition, and polarity configuration setting 251 may configure comparator output polarity control circuit 250 to output a positive voltage when a logic low signal is output from comparator 230. In other examples, device 200 may be configured to detect an under-temperature condition. Comparator 230 may monitor the voltage on positive polarity analog input signal 201 and may output a logic high signal when the voltage on positive polarity analog input signal 201 is below the voltage output of controllable voltage source 240. The logic high signal at comparator output 231 may represent an under-temperature condition, and polarity configuration setting 251 may configure comparator output polarity control circuit 250 to output a positive voltage when a logic high signal is output from comparator 230.

Comparator output counter circuit 260 may count cycles of clock input 261 while the output of comparator output polarity control circuit 250 may be logic high. After a predetermined number of clock cycles, comparator output counter circuit 260 may output a logic high signal at monitor output 262. The number of clock cycles may be specified by counter configuration setting 263. Monitor output 262 may trigger a conversion in ADC 210. Switch 203 and switch 204 may be in a closed position during analog-to-digital conversion. Once the output of comparator output polarity control circuit 250 is detected as logic low for a predetermined number of clock cycles, monitor output 262 may transition to a logic low level.

Monitor output 262 may be coupled to control circuit 270. Control circuit 270 may include internal trigger circuit 290. Internal trigger circuit 290 may take an input from monitor circuit 265, the input based on monitor output 262 and may generate internal trigger signal 295 based on one or more configuration settings. In one of various examples, an internal trigger configuration setting 291 may configure internal trigger circuit 290 to assert internal trigger signal 295 when monitor output 262 is asserted. Internal trigger signal 295 may be an interrupt signal, a general-purpose input/output (GPIO) signal, an alarm or alert signal, a trigger signal for ADC 210 to initiate a data conversion, or another type of signal not specifically mentioned. Switch 203 and switch 204 may be in a closed position during analog-to-digital conversion.

Control circuit 270 may include external trigger circuit 280. External trigger circuit 280 may take an input from monitor circuit 265, the input based on monitor output 262 and may generate external trigger signal 285 based on one or more configuration settings. In one of various examples, an external trigger configuration setting 281 may configure external trigger circuit 280 to assert external trigger signal 285 when monitor output 262 is asserted. External trigger signal 285 may be an interrupt signal, a general-purpose input/output (GPIO) signal, or another type of signal not specifically mentioned.

ADC control signal 275 may be output from control circuit 270 and may enable ADC 210 based on monitor output 262. ADC control signal 275 may comprise an ADC enable signal and an ADC clock signal coupled to ADC 210.

In this manner, device 200 may assert external trigger signal 285 and internal trigger signal 295 based on positive polarity analog input signal 201.

Monitor circuit 265 may receive a trigger signal from external input 268. External input 268 may be a general-purpose input-output (GPIO) pin, or may be another pin configured as an input. Monitor circuit 265 may assert ADC control signal 275 based on external input 268. Based on the assertion of ADC control signal 275, switch 220 may be in an open position and switches 203 and 204 may be in a closed position. In this manner, external input 268 may trigger a conversion in ADC 210, and the conversion output may update at output 299.

Once the low-power monitor path triggers monitor output 262, ADC 210 may be enabled by ADC control signal 275 to more precisely monitor positive polarity analog input 201 and negative polarity analog input signal 202.

The example of FIG. 2 is illustrated as a differential input, with positive polarity analog input signal 201 and negative polarity analog input signal 202. In other examples, a single-ended input may be monitored and negative polarity analog input signal 202 may be coupled to a ground node. In other examples, a pseudo-differential input may be monitored and negative polarity analog input signal 202 may be coupled to a common mode voltage.

Figure 3:
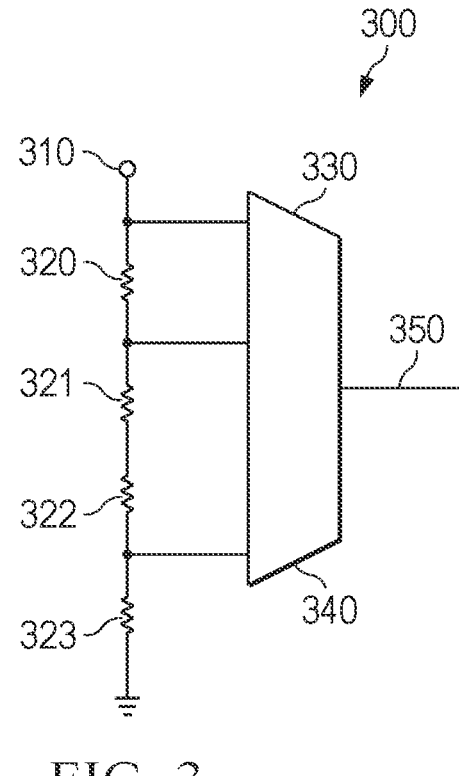
FIG. 3 illustrates one of various examples of a voltage source.

FIG. 3 illustrates one of various examples of a voltage source 300. Voltage source 300 may be one of various examples of controllable voltage source 140, as described and illustrated in reference to FIG. 1. The voltage source 300 illustrated in FIG. 3 is a resistor string implementation, but this is not intended to be limiting. Other examples of controllable voltage source 140 may be a DAC, a voltage-controlled voltage source, a current-controlled voltage source, or another implementation not specifically mentioned.

Reference voltage 310 may be coupled to one end of a resistor network. Reference voltage 310 may be provided by an external reference circuit, an internal reference circuit, a GPIO pin or by another circuit not specifically mentioned. The resistor network may be comprised of a plurality of resistors connected in series. A plurality of resistors 320, 321, 322, and 323 may be coupled in series between reference voltage 310 and ground node 325.

The example illustrated in FIG. 3 includes four resistors, but this is not intended to be limiting. Other examples may include more than 4 resistors, or fewer than 4 resistors.

Voltages at each node of the resistor string may be output to multiplexer 330. Resistors in the resistor network may be of different values. Resistors in the resistor network may all be of the same value.

Multiplexer 330 may select one node of the resistor string based on threshold select setting 340. Threshold select setting 340 may be one of various examples of threshold select setting 141, as described and illustrated in reference to FIG. 1.

Output 350 may be a voltage as selected by threshold select setting 340.

In operation, threshold select setting 340 may be a register setting which may be programmed, and which may select a voltage output. In the example illustrated in FIG. 3, threshold select setting 340 may select a voltage output equal to one quarter of reference voltage 310. Multiplexer 330 may select the node between resistor 322 and resistor 323 which would represent one quarter of reference voltage 310.

In other examples, threshold select setting 340 may select a voltage output equal to a percentage of reference voltage 310.

Figure 4:
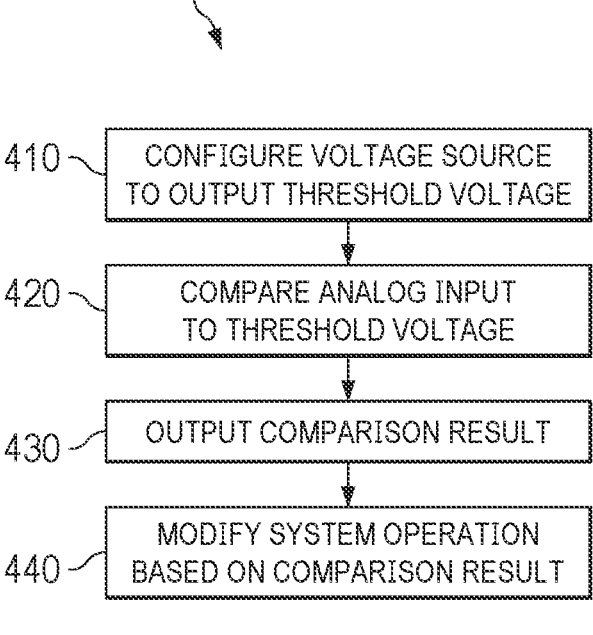
FIG. 4 illustrates a method for monitoring analog input signals.

FIG. 4 illustrates a method for monitoring analog input signals.

At operation 410, a voltage source may be configured to output a threshold voltage. The threshold voltage level may be set by a configuration register, by a GPIO pin, by software programming, or by another method not specifically mentioned.

At operation 420, an analog input may be compared to the threshold voltage. The analog input may be compared using a comparator circuit, an op-amp, or another method not specifically mentioned.

At operation 430, a comparison result may be obtained. In one of various examples, the comparison result may be a logic high level when the analog input voltage exceeds the threshold voltage level for a predetermined duration. In other examples, the comparison result may be a logic low level when the analog input voltage exceeds the threshold voltage level for a predetermined duration.

At operation 440, system operation may be modified based on the comparison result. In one of various examples, an ADC may be enabled based on the comparison result. In other examples, circuits may be enabled or may be disabled based on the comparison result. In other examples, an interrupt signal may be asserted or a GPIO pin may be asserted.

The invention claimed is:

1. A device comprising:
an analog-to-digital converter (ADC) to receive at least one analog input signal;
a voltage source to generate a threshold voltage, the threshold voltage based on a predetermined condition;
a comparator to receive the threshold voltage, and the comparator to generate a comparator output based on a comparison of the at least one analog input signal and the threshold voltage;
a comparator output polarity control circuit to generate an output based on the output of the comparator and based on a polarity configuration setting; and
a comparator output counter to count edges of a clock signal based on the output of the comparator output polarity control circuit, the count comprising a comparator output counter value, and to generate one or more monitor outputs based on the comparator output counter value.

2. The device as claimed in claim 1, the one or more monitor outputs comprising an alarm signal.

3. The device as claimed in claim 1, the one or more monitor outputs comprising an ADC enable signal, the ADC enable signal coupled to the ADC.

4. The device as claimed in claim 1, the one or more monitor outputs comprising an ADC clock signal, the ADC clock signal coupled to the ADC.

5. The device as claimed in claim 1, the predetermined condition comprising a register setting to specify a threshold voltage level.

6. The device as claimed in claim 1, the threshold voltage comprising a percentage of a reference voltage.

7. The device as claimed in claim 1, the one or more monitor outputs generated based on the comparator output counter value reflective of a minimum time period.

8. A system comprising:
an analog-to-digital converter (ADC) to receive at least one analog input signal;
a voltage source to output a threshold voltage, the threshold voltage based on a predetermined condition;
a switch to selectively couple the at least one analog input signal to a comparator, the comparator to receive the threshold voltage, and the comparator to generate a comparator output based on a comparison of the at least one analog input signal and the threshold voltage;
a comparator output polarity control circuit to generate an output based on the output of the comparator and based on a polarity configuration setting;

a comparator output counter to count edges of a clock signal based on the output of the comparator output polarity control circuit, the count comprising a comparator output counter value, and to generate one or more monitor outputs based on the comparator output counter value; and a microcontroller to receive the one or more monitor outputs.

9. The system as claimed in claim 8, the one or more monitor outputs comprising an alarm signal.

10. The system as claimed in claim 8, the one or more monitor outputs comprising an ADC clock signal and an ADC enable signal, the ADC clock signal and ADC enable signal coupled to the ADC.

11. The system as claimed in claim 8, the one or more monitor outputs to initiate a conversion of the at least one analog input signal by the ADC.

12. The system as claimed in claim 8, the one or more monitor outputs based on the comparator output counter reaching a predetermined value.

13. The system as claimed in claim 8, the threshold voltage comprising a minimum value of the at least one analog input signal.

14. A method comprising:

configuring a voltage source to output a threshold voltage;

comparing an analog input signal to the threshold voltage;

obtaining a comparison result;

counting, based on the comparison result, edges of a clock signal, the count comprising a comparator output counter value;

generating one or more monitor outputs based on the comparator output counter value; and modifying system operation based on the one or more monitor outputs.

15. The method as claimed in claim 14, configuring a voltage source comprising setting a voltage value based on a register setting.

16. The method as claimed in claim 14, the threshold voltage based on a register setting.

17. The method as claimed in claim 14, the threshold voltage comprising a percentage of a reference voltage.

18. The method as claimed in claim 14, modifying system operation comprising asserting an alarm signal, the alarm signal coupled to a microcontroller.

19. The method as claimed in claim 14, modifying system operation comprising enabling an ADC to perform a conversion of the analog input signal.

* * * * *